United States Patent [19]
Lombardi

[11] Patent Number: 5,828,983
[45] Date of Patent: Oct. 27, 1998

[54] METHOD AND APPARATUS FOR PROCESSING A SAMPLED WAVEFORM

[75] Inventor: Steven A. Lombardi, Waukesha, Wis.

[73] Assignee: Allen Bradley Company, LLC, Milwaukee, Wis.

[21] Appl. No.: 705,568

[22] Filed: Aug. 29, 1996

[51] Int. Cl.$^6$ .................................................. G01R 13/34
[52] U.S. Cl. .......................... 702/66; 702/67; 324/76.15; 324/76.17; 324/76.38
[58] Field of Search .................................... 364/480, 481, 364/483–487, 492, 178, 179, 550, 551.01, 577, 579, 723, 853; 324/140 R, 141, 142, 76.15, 76.17, 24, 38, 58, 509; 361/93, 79

[56] References Cited

U.S. PATENT DOCUMENTS

| | | | |
|---|---|---|---|
| 5,235,534 | 8/1993 | Potter | 364/723 |
| 5,378,979 | 1/1995 | Lombardi | 324/509 |
| 5,498,956 | 3/1996 | Kinney et al. | 364/483 |
| 5,528,134 | 6/1996 | Davis et al. | 324/76.24 |
| 5,627,718 | 5/1997 | Engel et al. | 361/79 |

Primary Examiner—Emanuel Todd Voeltz
Assistant Examiner—Hal D. Wachsman
Attorney, Agent, or Firm—Patrick S. Yoder; John M. Miller; John J. Horn

[57] ABSTRACT

A method and apparatus are provided for approximation of integral and RMS values for waveforms of uncertain or unknown period. The technique employed processes values of the waveform sampled at fixed sampling intervals, monitors the actual period of the waveform, and calculates the number of fixed sampling intervals in the period. The sampled data is then used as a basis for mapping the waveform onto a desired number of sampling points. Interpolation techniques are used to assign values to desired sampling points lying between fixed interval sampled points. The desired number of sample points is selected to permit use of Simpson's rule for approximating the integral value (an odd number of points for application of Simpson's $\frac{1}{3}$ rule, and a number equal to a multiple of 3 plus 1 for application of Simpson's $\frac{3}{8}$ rule). Once the desired sampling points are determined, Simpson's rule is applied to calculate the integral, and the RMS value may be determined based on this integral value.

20 Claims, 4 Drawing Sheets

METHOD AND APPARATUS FOR PROCESSING A SAMPLED WAVEFORM

BACKGROUND OF THE INVENTION

The present invention relates generally to digital sampling of waveforms and to processing sampled data to generate representative values useful in various monitoring, control and information recordal operations. More particularly, the invention provides a method and apparatus for processing a sampled information on a waveform of interest to permit high accuracy estimation of integral values, such as for determination of root-mean-squared (RMS) values, via Simpson's rule. The invention is particularly suited for high precision power monitoring and similar applications.

The advent of digital signal processing has provided improved techniques for monitoring and controlling a vast array of systems previously handled by mechanical or analog electrical apparatus. As digital signal processors have become faster and less expensive their applicability has further increased, permitting them to replace analog systems in many applications without jeopardizing system stability. As a result, digital monitoring and control systems, typically based around a programmed microprocessor, are currently applied on a wide range of industrial and consumer devices.

Despite their considerable advantages, known digital processing systems still suffer from certain constraints. For example, many monitoring and control systems require sampling of waveforms, typically voltage or current levels, and generation, from the sampled data, of time integral values. One common use for such integral values is in calculations of RMS values for the sampled waveforms, such as for continuous power monitoring. However, where waveforms are reduced to a plurality of discrete sampled values for digital processing, resort must be had to various approximation techniques for determining the time integrals. Common techniques include the rectangular approximation method and the trapezoidal rule, both of which inherently result in a generally unacceptable degree of error. Moreover, system designers are generally faced with a limited overall system "error budget" which must include signal processing and approximation errors as well as precision tolerances for the various hardware elements in the system. Thus, reduction of the approximation errors in integral and RMS calculations is a useful goal, permitting the designer to allocate a greater portion of the error budget to other elements of the system, such as less costly hardware elements.

Heretofore, alternative approaches to reduction of inherent error in approximated integral and RMS values have not been viable in known monitoring and control systems. For example, it is generally known that approximation errors can be reduced by increasing the number of sample points to more closely trace the original waveform. However, as the number of sample points increases, so does the processing time required to reduce the sampled data to the desired integral or RMS value, ultimately leading to unacceptable time delays or costly increases in processing power. Moreover, while it is generally known that Simpson's rule for approximating integrals offers a more accurate approximation, application of this rule requires a set number (odd or a multiple of 3 plus 1) of sample points. Because many systems sample at fixed intervals and operate on waveforms of potentially varying period (e.g., power grid voltage waveforms), this prerequisite for application of Simpson's rule has been difficult to satisfy, it being uncertain whether the number of samples in the period will correspond to the number needed for application of the rule. While, theoretically, the sampling interval may be varied to ensure that a desired number of data points span the waveform of interest, in practice this approach assumes knowledge of the waveform period and requires an infinitely variable sampling frequency, making the approach impractical to implement.

It would be advantageous, therefore, to provide a technique for ensuring that the number of sample points for a waveform of varying or unknown period will be consistently equal to a desired number, enabling the use of Simpson's rule to approximate integral and RMS values having a lower approximation error as compared to alternative approximation methods. In particular, an improved technique is needed for processing sampled data to provide improved accuracy in such approximations without unduly extending processing time or requiring significantly more processing power.

SUMMARY OF THE INVENTION

The present invention features a method and apparatus for processing sampled waveform data designed to respond to these needs. Because the inventive technique effectively reduces or maps the sampled waveform onto a desired number of data points, it permits the use of Simpson's rule for approximating integral and RMS values despite variations in the period of the waveform and the use of fixed sampling intervals. The number of data points may be selected and averaging techniques employed to provide enhanced accuracy and accommodate processing time delay constraints for particular systems. The technique is particularly useful in digitally monitored and controlled systems, such as industrial regulating systems, but may be applied in a wide range of applications.

Thus, in accordance with a first aspect of the invention, a method is provided for analyzing a waveform of unknown period. The method includes the steps of sampling a parameter of the waveform and determining first magnitude values of the parameter at a plurality of sample intervals. A desired number of second magnitude values of the parameter are then derived from the first magnitude values. Simpson's Rule is applied to the second magnitude values to generate an integral value for the parameter over the plurality of intervals. The integral value may then be used as a basis for generating a root-mean-squared value for the parameter. In a particularly preferred embodiment, an odd number of second magnitude values is used for application of Simpson's ⅓ Rule. However, Simpson's ⅜ Rule could also be applied by use of an appropriate number of second magnitude values (i.e., a multiple of 3 plus 1).

In accordance with a particularly preferred embodiment of the invention, a method is provided for determining a root-mean-squared value of a parameter of a waveform having an unknown period. The method includes the steps of generating first values representative of the parameter at sample intervals of predetermined duration, determining the period of the waveform and determining the number of sample intervals from the predetermined duration and the waveform period. Desired sample locations along the waveform are then determined by dividing the number of sample intervals by a desired number of samples. From the first values, second values representative of the parameter at the desired sample locations are generated. An integral value for the parameter is then calculated by applying Simpson's Rule to the second values and the root-mean-squared value is calculated from the integral value.

The invention also provides an apparatus for monitoring and analyzing a waveform of uncertain period including a sensor, a sampling circuit, a memory circuit and a signal processing circuit. The sensor detects a parameter of interest for the waveform and generates parameter signals representative of first values of the parameter. The sampling circuit is coupled to the sensor. The sampling circuit monitors the parameter signals and samples the first values at predetermined sampling intervals. The memory circuit is coupled to the sampling circuit and saves the sampled first values. The signal processing circuit is coupled to the memory circuit and is configured to determine the period of the waveform and the number of sample intervals in the period. The signal processing circuit also determines a plurality of desired sample locations along the waveform based upon the waveform period, the number of sample intervals and a desired number of samples. The signal processing circuit is further configured to determine second values for the parameter at each of the desired sample locations and to calculate an integral value for the parameter over the period. In a preferred form, the signal processing circuit approximates the integral value using Simpson's rule and derives a root-mean-squared value for the parameter from the integral value.

BRIEF DESCRIPTION OF THE DRAWINGS

The present invention will become more fully understood from the following detailed description, taken in conjunction with the accompanying drawings, wherein like reference numerals refer to like parts, in which.

DESCRIPTION OF THE PREFERRED EMBODIMENTS

Figure 1:
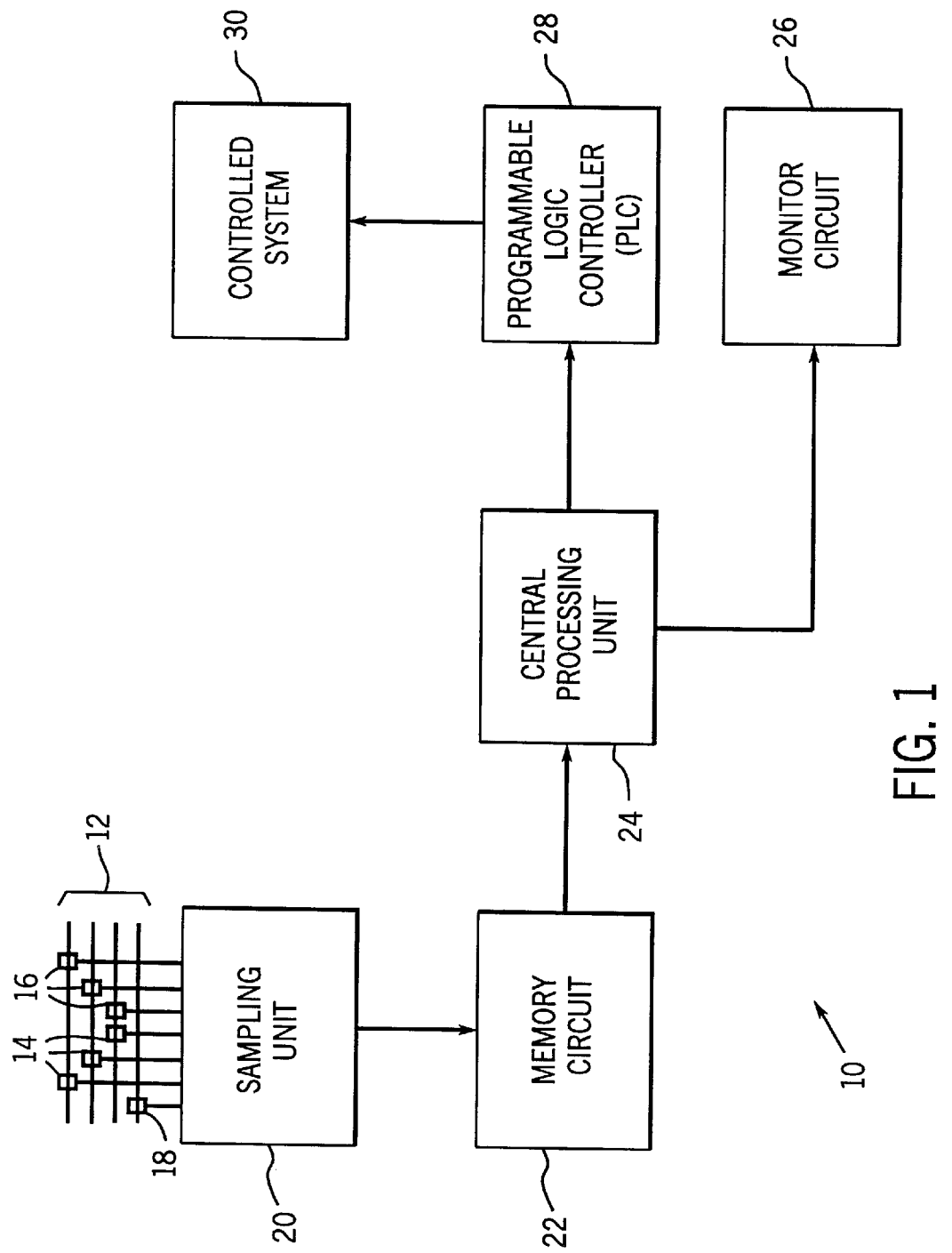
FIG. 1 is a diagrammatical view of an exemplary monitoring and control system including circuitry for sampling and processing a parameter waveform.

Turning now to the drawings and referring to FIG. 1, an exemplary monitoring and control system 10 for sampling and processing parameter signals is illustrated diagrammatically. In the embodiment depicted in FIG. 1, voltage and current levels of power signals through three phase and ground conductors 12 are sensed by voltage and current transducers 14, 16 and 18. Transducers 14, 16 and 18 may be of any suitable type well known in the art. A sampling unit 20 monitors output signals from the transducers and periodically samples or downloads the magnitude of the signals, saving the sampled values in a memory circuit 22. Circuitry comprising sampling unit 20 and memory circuit 22 may also be of a type known in the art, typically including multiplexing circuits, analog-to-digital converting circuits and filtering and isolation circuitry. Sampling unit 20 preferably samples the waveforms of interest (e.g., voltage or current) at rates substantially higher than the anticipated period of the waveforms, such as at a rate of 10.8 kHz, yielding an anticipated 180 samples per cycle for nominal 60 Hz waveforms.

Sampled values stored in memory circuit 22 are accessed and analyzed by a central processing circuit 24, which may be integrated in a stand-alone monitor or interfaced with other external monitoring and control devices, such as in an industrial control system. In the embodiment depicted in FIG. 1, central processing circuit 24 is coupled to a monitor circuit 26, which typically will be configured to save and display statistical data resulting from waveform analyses performed by central processing circuit 24 as described below. Central processing circuit 24 may also be coupled to one or more control circuits, such as a programmable logic controller 28, configured to execute a predetermined control routine, such as for process or manufacturing control. Controller 28 will typically be linked to various actuators of a controlled system, represented generally by the reference numeral 30, in a conventional manner.

Figure 2:
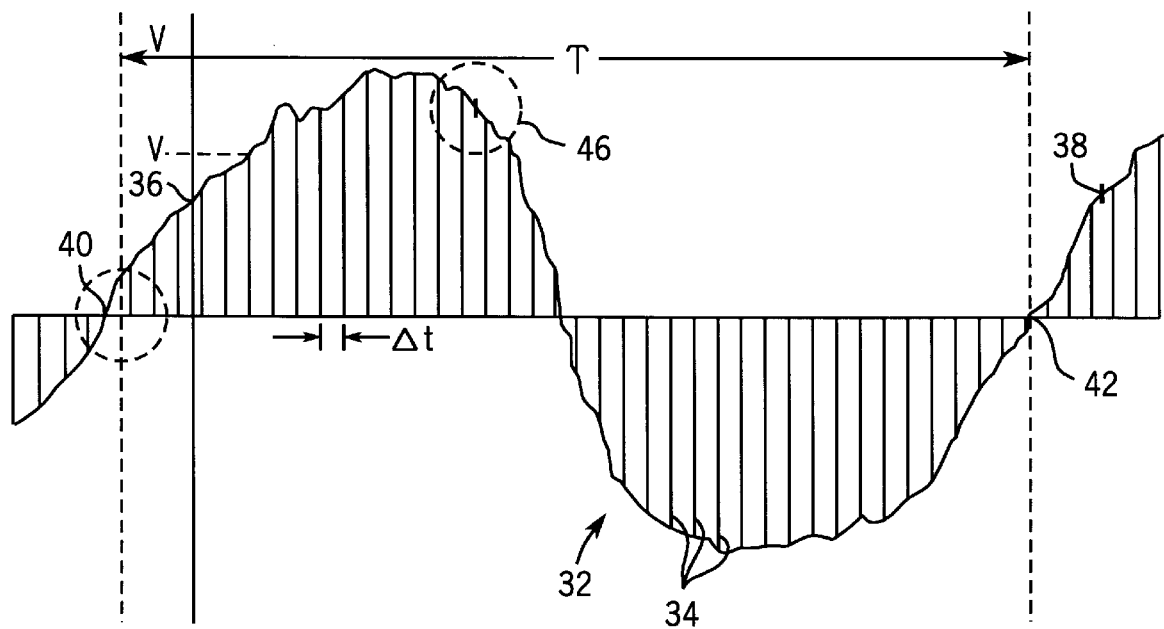
FIG. 2 is a graphical representation of a waveform sampled by the system illustrated in FIG. 1.

In typical sampled data control systems of the type depicted in FIG. 1, one function of central processing circuit 24 is to process the values for the waveforms sampled by sampling unit 20 and to generate integral values (typically time integral values) from the sampled data. Such integral values may themselves be stored for monitoring or used in various control functions, or may be used as a basis for calculating root-mean-squared (RMS) values of interest for additional monitoring and control functions, such as electrical power monitoring. FIG. 2 graphically illustrates data sampled for an exemplary waveform 32 on which such analyses are to be performed.

As shown in FIG. 2, waveform 32 is periodic in nature, but is assumed to have an unknown or uncertain period T. While the particular waveform illustrated in FIG. 2 is generally sinusoidal in form, it should be noted that the following technique for analyzing the sampled data is equally applicable to non-sinusoidal waveforms or to waveforms varying in profile. By way of example, waveform 32 is illustrated as a periodic, time varying voltage waveform for which sample values 34 of magnitude v are collected at fixed intervals $\Delta t$. Displayed sequentially, these sample values map the waveform over time, beginning from an initial sample time 36. It should be noted that, for the purposes of the analysis technique described below, while the analyzed segment of the waveform spans a period T (i.e. beginning at time 36 and ending at a time 38 located in time a distance T from beginning time 36), the segment need not start at a zero crossing point 40 and end at a zero crossing point 42, the latter points being generally unknown due to the uncertain period of the waveform.

Figure 3:
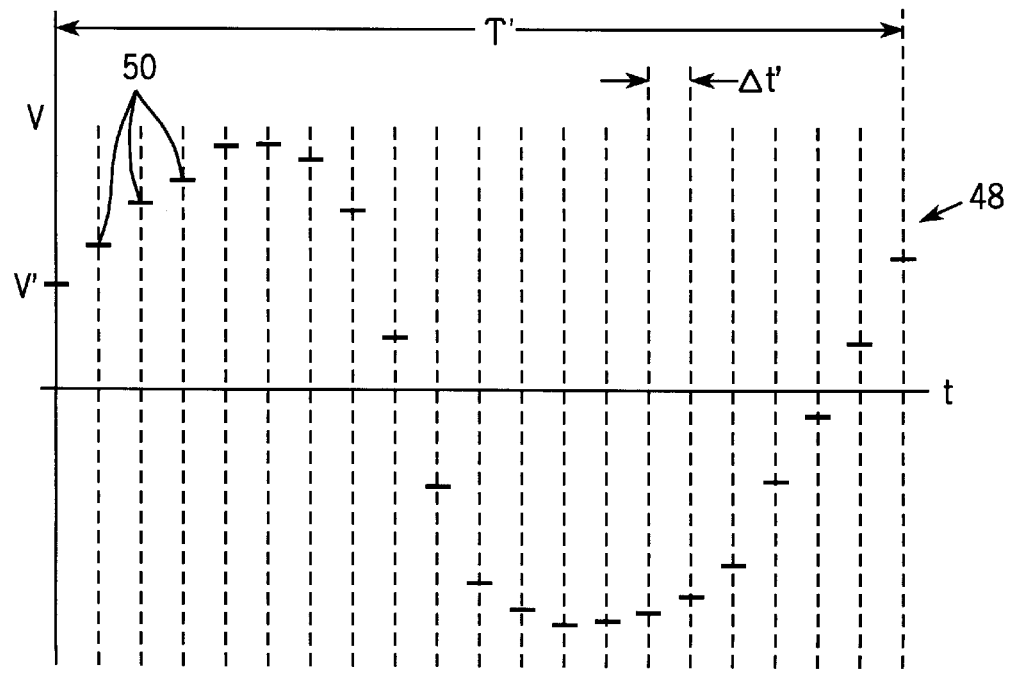
FIG. 3 is a graphical representation of a waveform generated by processing data from the sampled waveform shown in FIG. 2.

The present technique affords analysis of waveform 32, including approximation of the integral of the waveform, through the use of Simpson's rule. In general, the technique maps the sampled waveform onto a desired number of sample points, as illustrated in FIG. 3, permitting application of Simpson's rule to the resulting sample values. As will be appreciated by those skilled in the art, because the fixed interval sampling times are unlikely to correspond precisely to desired sample points, mapping of the waveform of interest onto the desired number of sampling points will commonly require evaluation of the magnitude of the waveform at points lying between sampled data points, as indicated by the reference numeral 46 in FIG. 2. In the presently preferred embodiment, an interpolation technique is employed to estimate a magnitude value at such locations, as described below with reference to FIG. 4. Moreover, while for the purposes of converting the waveform of interest to the desired number of sample points it is necessary to determine the period of the waveform and the number of fixed interval samples in the waveform, it is not necessary that the number of fixed intervals in the period be an integer value. Indeed, because the period is assumed to be unknown or varying in an uncertain manner, this will generally not be the case. Thus, in determining the number of fixed interval sample points in the waveform period, in addition to sampling the waveform, the present technique preferably converts the waveform to a square wave to identify zero crossing points and thereby to measure the period. In an alternative method for determining the period of the waveform, an interpolation technique may be used for determining fractional portions of the fixed intervals that should be considered in the period being evaluated, as discussed below with respect to FIG. 5. Once the period and number of fixed intervals in the period are known, the fixed interval sampled data is converted to the desired number of sample points, and the waveform 32 is represented in memory circuit 22 by a mapped waveform 48 comprised of the desired number of sample points 50 of magnitude v', as represented in FIG. 3.

Figure 5:
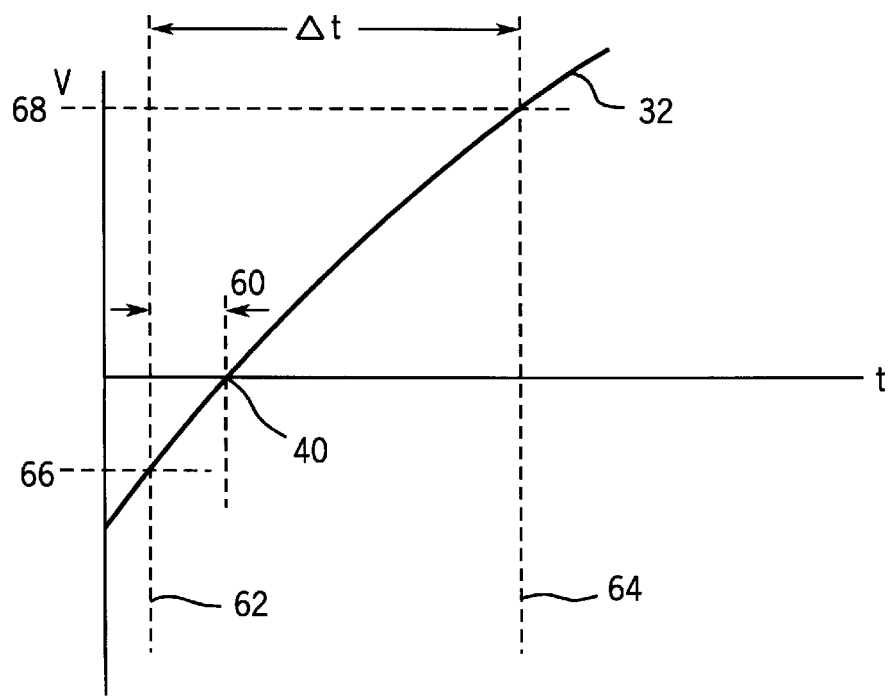
FIG. 5 is a detail view of a portion of the waveform shown in FIG. 2, illustrating a preferred technique for determining the number of fixed interval sampling periods in the waveform period.
Figure 6:
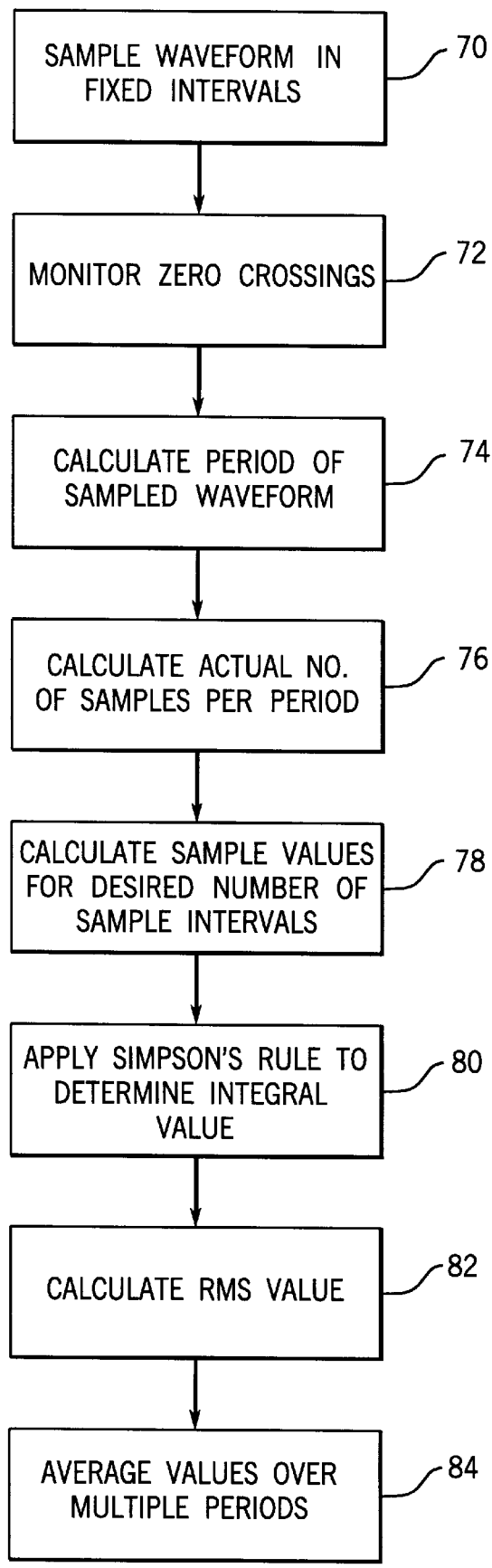
FIG. 6 is a flow chart illustrating exemplary logic for sampling a waveform as in FIG. 2 and reducing the sampled data to map the waveform into a desired number of data points as shown in FIG. 3, and for processing the data points to generate integral and RMS values.

Steps in exemplary control logic for performing this mapping or analysis function are illustrated in FIG. 6. As summarized above, the technique begins with the fixed interval sampling of the waveform by sampling unit 20 as indicated at step 70 of FIG. 6. Values thus sampled are stored in memory circuit 22. At step 72, central processing circuit 24 identifies locations of zero crossings 40 and 42. In the presently preferred embodiment, an analog circuit (not shown) is coupled to the output of transducers 14, 16 and 18 to convert the waveform into a square wave, and this square wave is monitored for the occurrence of two successive positive-going zero crossings. The period T is then measured directly by reference to the time between the zero crossings, as indicated at step 74. Alternatively, the sampled data points may be accessed and analyzed to determine sample points lying on either side of a zero crossing (or, more rarely, on a zero crossing).

Where the latter technique is employed, zero crossing times are estimated as illustrated in FIG. 5. For the fixed interval $\Delta t$, a zero crossing 40 may occur an unknown period 60 after a sampling point 62, but before a subsequent sampling point 64. The length of the time period 60 may be estimated through interpolation by referring to the magnitudes 66 and 68 of the monitored parameter at the adjacent sampling times 62 and 64, respectively. In a preferred method, period 60 is estimated by linear interpolation between samples 66 and 68. In particular, the sampled data points are examined to identify zero crossing points (e.g., by monitoring a sign bit for a sign change). The actual zero crossing time is estimated by then interpolating between sampled points 66 and 68 immediately before and after the zero crossing. This process is then repeated for the next like (positive or negative going) zero crossing in the data. The period T is then easily calculated by determining the time elapsed between zero crossings.

Returning to FIG. 6, after measuring or calculating the period T at step 74, circuit 24 calculates the actual number of fixed intervals in the period T by dividing the period duration by the length of the fixed sampling interval, as indicated at step 76. As indicated above, the number of fixed intervals in the period T resulting from this calculation need not be an integer value.

As indicated at step 78 of FIG. 6, based upon the number of actual fixed sampling intervals in the waveform period, circuit 24 next calculates the value for each desired sample point. In the presently preferred embodiment, the first sample value in the mapped waveform is set equal to the initial value for the period under examination (i.e., the initial sampled data point). In addition, in the presently preferred embodiment the final sample value in the mapped waveform is set equal to the fixed interval sample value nearest the trailing edge of the waveform being evaluated. Alternatively, interpolation techniques, such as that described below may be used to assign values to first and last sample values in the mapped waveform, particularly where such values fall between fixed interval sample points.

For all other points $P_i$ of the mapped waveform, a location $tv_i$ along the sampled waveform is identified in accordance with the relationship:

$$tv_i = P_i(n/d) \quad (1);$$

where $tv_i$ is the location of the desired value, n is the actual number of fixed sampling intervals in the waveform period, d is the desired number of sampling points (odd for application of Simpson's 1/3 rule, and a multiple of 3 plus 1 for application of Simpson's 3/8 rule), and $P_i$ is the integer number of the desired data point (where i varies from 2 to d-1). It should be noted that neither $tv_i$ nor n need be integer values. It should also be noted that, for convenience, the nomenclature used in the present discussion assigns to the initial sampled and mapped waveform values the subscript value "1" such that the subscript value for the final data point in the mapped waveform will be the desired number of data points d for the application of Simpson's rule.

Figure 4:
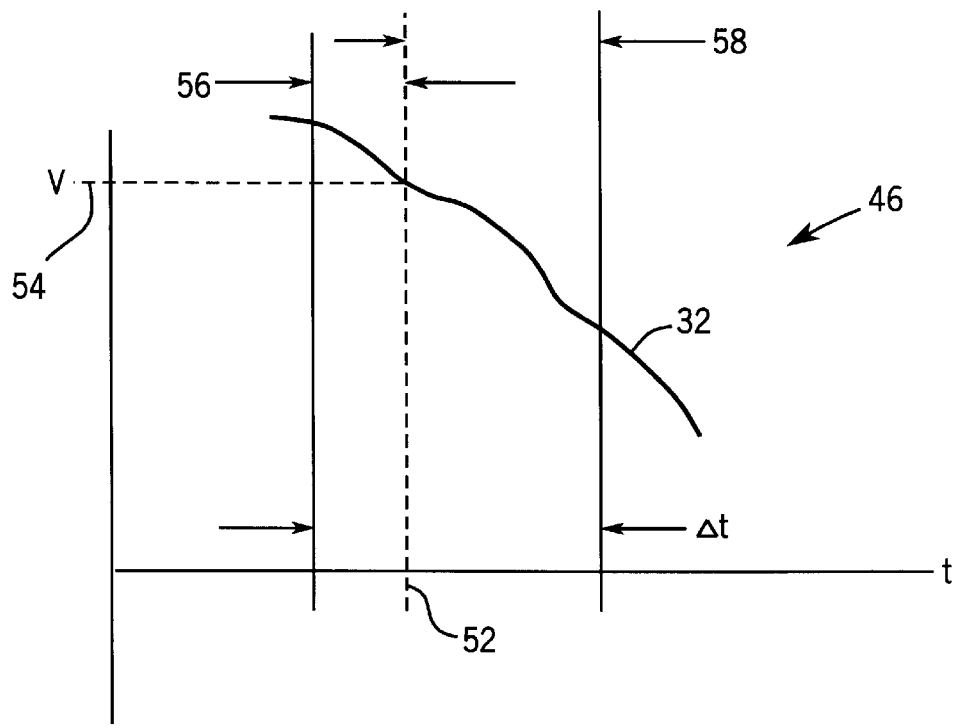
FIG. 4 is a detail view of a portion of the waveform shown in FIG. 2, illustrating a preferred technique for mapping points along the waveform between sampled data points.

In the presently preferred embodiment, as a general rule, it is assumed that the location of a desired sample point will not correspond to a fixed interval sampled data point. Thus, to evaluate the value of the desired sample point at locations $tv_i$ other than the initial and final locations, an interpolation technique is employed as illustrated in FIG. 4. For an intermediate desired sample location 52, the value 54 of the monitored parameter V is preferably determined by linear interpolation between adjacent fixed interval sampled data values. As will be appreciated by those skilled in the art, such interpolation, based upon the ratio of the desired fixed interval portion 56 or 58 to the fixed interval duration $\Delta t$, provides a value to be added or subtracted from the leading (or following) fixed data point to estimate the value of waveform 46 at the desired sample point 52 (i.e., $tv_i$.) It should also be noted that in the rare cases when the desired sample point corresponds to a fixed interval sample point, this interpolation technique results in properly assigning to the desired sample point the value of the sampled data point.

Returning to FIG. 6, once values have been assigned to all desired sample data points, central processing circuit 24 determines the integral of waveform 32, preferably by application of Simpson's 1/3 rule to an odd number of mapped sample points. Simpson's 1/3 rule is may be expressed by the relationship:

$$I = \tfrac{1}{3}\Delta t'(v_{(1)} + 4v_{(2)} + 2v_{(3)} + 4v_{(4)} + 2v_{(5)} + \ldots + 2v_{(d-2)} + 4v_{(d-1)} + v_{(d)}) \quad (2);$$

where I is the integral value for waveform 32 over period T, d is the desired number of data points, and $\Delta t'$ is the duration of the time interval between desired sample points (determined by dividing the period T by the number of sample points d). The resulting integral value may be stored in memory circuit 22, utilized in a preset control routine implemented by unit 24 or PLC 28.

Where an RMS value is desired, the integral value is preferably calculated from the relationship:

$$I = \tfrac{1}{3}\Delta t'(v^2_{(1)} + 4v^2_{(2)} + 2v^2_{(3)} + 4v^2_{(4)} + 2v^2_{(5)} + \ldots + 2v^2_{(d-2)} + 4v^2_{(d-1)} + v^2_{(d)}) \quad (3).$$

The desired RMS value is then calculated, as indicated by step 82 in FIG. 6. The latter calculation is performed in accordance with the relationship:

$$V_{RMS} = [(1/T)(I)]^{1/2} \quad (4);$$

where $V_{RMS}$ is the RMS value, T is the waveform period, and I is the integral value determined by equation (3). The resulting RMS value is then stored in memory circuit 22, used in further signal processing or control, or displayed via monitor circuit 26.

Subsequent signal processing of integral or RMS values obtained by equations (2) and (3) may include averaging over multiple periods, as indicated at step 84 of FIG. 6. As will be appreciated by those skilled in the art, such averaging is often useful for smoothing deviations in the integral or RMS values between cycles. In a preferred embodiment, a running average of the integral or RMS values is calculated and maintained over a number of waveform cycles.

By way of example, the foregoing technique was used to determine RMS values for a cyclical voltage signal in three different modes of operation and the results of the analysis were compared to RMS values obtained by a high precision monitoring instrument. In all modes, the waveform was originally sampled at a rate of 10.8 kHz for a waveform nominal frequency of 60 Hz. In a first mode, the waveform was mapped onto 21 data points (d=21) and no averaging of waveform cycles was performed. An updating delay of approximately 27 ms was realized, which included all interpolation, integral and RMS calculations. In a second mode, the waveform was mapped onto 61 data points (d=61) and a running average was maintained over 8 waveform cycles. An update delay per cycle of approximately 50 ms was realized in this second mode. In a third mode, the waveform was mapped onto 121 data points and a running average was maintained over 16 cycles, realizing an update delay per cycle of approximately 80 ms. In all cases, the error of the resulting RMS calculations did not exceed approximately 0.015%.

While the embodiments illustrated in the FIGURES and described above are presently preferred, it should be understood that these embodiments are offered by way of example only and may be adapted to various other structures. For example, while the foregoing description has been based on mapping the waveform of interest onto an odd number of sample points for application of Simpson's ⅓ rule, an appropriate number of mapped sample points could be selected and determined by the above technique for application of Simpson's ⅜ rule. In general the latter rule requires that the number of sample points be a multiple of 3 plus 1.

I claim:

1. A method for analyzing a waveform of unknown period comprising the steps of:
   (a) sampling a parameter of the waveform and determining first magnitude values of the parameter at a plurality of sample intervals, the sample intervals having a predetermined uniform duration independent of the waveform period;
   (b) determining the period of the waveform;
   (c) determining the number of sample intervals in the period, the number of sample intervals in the period being an integer or non-integer value;
   (d) deriving a desired number of second magnitude values of the parameter from the first magnitude values, the desired number of second magnitude values being an integer appropriate for application of Simpson's rule for determination of an integral value for the waveform over the plurality of intervals; and
   (e) applying Simpson's rule to the second magnitude values to generate an integral value for the parameter over the plurality of intervals.

2. The method of claim 1, wherein the desired number is odd and the Simpson's rule applied is Simpson's ⅓ rule.

3. The method of claim 1, wherein the desired number is a multiple of 3 plus 1, and the Simpson's rule applied is Simpson's ⅜ rule.

4. The method of claim 1, wherein the period of the waveform is determined by monitoring the first magnitude values.

5. The method of claim 1, wherein the second magnitude values are derived by determining desired locations by dividing the number of sample intervals by the desired number of second magnitude values and determining the magnitude of the parameter at the desired sample locations, and wherein first and last second magnitude values are assigned values of first and last first magnitude values, respectively.

6. The method of claim 1, wherein the integral value is generated over a plurality of waveform periods.

7. The method of claim 1, wherein desired sample locations for second magnitude values not corresponding to sample intervals for first magnitude values are derived from the first magnitude values via interpolation between adjacent first magnitude values.

8. The method of claim 1, comprising the further step of determining a root-mean-squared value for the parameter from the integral value.

9. A method for determining a root-mean-squared value of a parameter of a waveform having an unknown period, comprising the steps of:
   (a) generating first values representative of the parameter at sample intervals of predetermined duration;
   (b) determining the period of the waveform;
   (c) determining the number of sample intervals from the predetermined duration and the waveform period;
   (d) determining desired sample locations along the waveform by dividing the number of sample intervals by a desired number of samples;
   (e) from the first values, deriving second values representative of the parameter at the desired sample locations;
   (f) calculating an integral value for the parameter by applying Simpson's rule to the second values; and
   (g) calculating the root-mean-squared value from the integral value.

10. The method of claim 9, the period of the waveform is determined by monitoring the first values and identifying times at which the first values cross predetermined threshold values.

11. The method of claim 9, wherein for desired sample locations not corresponding to sample intervals, the second values are derived by interpolating between first values for sample intervals before and after the desired sample location.

12. A The method of claim 9, comprising the further steps of generating root-mean-squared values for a plurality of waveform periods and averaging the root-mean-squared values over the plurality of waveform periods.

13. The method of claim 9, wherein the desired number of samples is selected from a group consisting of 21, 61 and 121 samples.

14. An apparatus for monitoring and analyzing a waveform of uncertain period comprising:
- a sensor for detecting a parameter of interest for the waveform and for generating parameter signals representative of first values of the parameter;
- a sampling circuit coupled to the sensor, the sampling circuit monitoring the parameter signals and sampling the first values at predetermined sampling intervals, the sample intervals having a predetermined, uniform duration independent of the waveform period;
- a memory circuit coupled to the sampling circuit, the memory circuit saving the sampled first values; and
- a signal processing circuit coupled to the memory circuit, the signal processing circuit determining the period of the waveform and the number of sample intervals in the period, the signal processing circuit determining a plurality of desired sample locations along the waveform based upon the waveform period, the number of sample intervals and a desired number of samples, the signal processing circuit determining second values for the parameter at each of the desired sample locations, the desired number of samples being an integer appropriate for application of Simpson's rule for determination of an integral value for the waveform over the sample intervals, the signal processing circuit being further configured to calculate an integral value for the parameter over the sample intervals by application of Simpson's rule to the second values.

15. The apparatus of claim 14, wherein the waveform is a sinusoidal electrical power signal and the sensor detects electrical current through a power conductor.

16. The apparatus of claim 14, wherein the signal processing circuit includes a programmed microprocessor.

17. The apparatus of claim 14, wherein the signal processing circuit is configured to determine the period of the waveform by monitoring the first values and determining times at which the first values cross a predetermined threshold value.

18. The apparatus of claim 14, wherein the signal processing circuit is configured to derive a root-mean-squared value for the parameter from the integral value.

19. The apparatus of claim 18, wherein the signal processing circuit is configured to generate integral values for a plurality of periods, to derive root-mean-squared values from each of the integral values, and to average the root-mean-squared values.

20. The apparatus of claim 18, wherein the signal processing circuit stores in the memory circuit the root-mean-squared values for the parameter.

* * * * *